United States Patent [19]

Schiek et al.

[11] Patent Number: 4,977,376

[45] Date of Patent: Dec. 11, 1990

[54] METHOD FOR DISTRUBANCE REDUCTION IN MEASUREMENT SYSTEMS FOR ANALYSIS OF EMISSION OR TRANSMISSION PROCESSES

[75] Inventors: Burkhard Schiek, Bochum; Gartner F. Uwe, Heidelberg, both of Fed. Rep. of Germany

[73] Assignee: Laboratorium Prof. Dr. Rudolf Berthold, Wildbad, Fed. Rep. of Germany

[21] Appl. No.: 238,582

[22] Filed: Aug. 31, 1988

[51] Int. Cl.$^5$ .......................................... G01R 29/26
[52] U.S. Cl. .................................. 324/613; 324/605; 324/620; 324/628; 324/637; 324/79 R; 455/295; 455/315
[58] Field of Search ................... 324/57 N, 475, 58 C, 324/58.5 C, 58 R, 58.5 R, 79 R, 79 D, 57 DE, 57 H, 613, 614, 628, 629, 630, 620, 622, 639, 641, 637, 626, 612, 615, 605; 455/226, 295, 314, 315

[56] References Cited

U.S. PATENT DOCUMENTS

| | | | |
|---|---|---|---|
| 2,812,492 | 10/1957 | Pfleger | 324/57 H |
| 3,041,532 | 6/1962 | Bidlingmailer et al. | 324/57 H |
| 3,227,949 | 1/1966 | Oberbeck | 324/57 H |
| 3,411,079 | 11/1968 | Palatinus | 324/57 H |
| 4,313,216 | 1/1082 | Jaeger et al. | 455/226 |

OTHER PUBLICATIONS

Reinschlüssel, Reinhard: *Ein Gasspektrometer hoher Nachweisempfindlechkeit im Millimeterwellenbereigh* [Gas Spectrometer with High Detection Sensitivity in the Millimeter Wave Range]; Dissertation, Bochum 1985.
Spaude, Manfred: *Ein impedanzunabhangiges Messverfahen zur Bestimmung von Zweipol-Rauschtemperaturen im Hochfrequenzbereich* [A Measuring Method Independent of Impedance for the Determination of Bipolar Noise Temperatures in the High Frequency Range]; Dissertation, Bochum 1984, p. 17, FIG. 2.5.
Dalichau, H.: *Hochfrequenzmesstechnik* [High Frequency Measuring Technology] in Meinke–Gundlach, "Taschenbuch der Hochfrequenztechnik", [High Frequency Technology Handbook], vol. 1, publ. by K. Lange and K. -H. Löcherer, Heidelberg: Springer 1986, FIG. 7.
King, R. J.: *Microwave Homodyne Systems*, Peter Peregrinus Ltd., Southgate House, Stevenage, England 1978, pp. 5–6, 38–40.
Schiek, Burkhard: *Mestrasse–Systeme der Hochfrequenztechnik* [Measurement Systems for Radio-Frequency Technology] Heidelberg, Huthig, 1984, p. 133, FIG. 4.9.
Groll, Horst: *Microwellenme Technik* [Microwave Measurement Technology], Braunschweig, Vieweg, 1969, p. 240.

*Primary Examiner*—Reinhard J. Eisenzopf
*Assistant Examiner*—Robert W. Mueller
*Attorney, Agent, or Firm*—Spensley Horn Jubas & Lubitz

[57] ABSTRACT

For the reduction of noise signals, and particularly crosstalk signals, in measurement systems for analyzing emission or transmission processes and composed of a serial arrangement of a signal source (1), a measurement path (2) with or without a transmission test object (8), a detector (3), and a measurement and display circuit (5), an identification modulation is imparted to the signal component carried in the measurement path by means of repeated modulation (6, 9). The evaluation of the detector output signal may be performed with respect to a frequency which is free of the effects of the single modulation signals occurring in the detector output signal because of noise pick-up. Use of this method in homodyne systems for quadrupole parameter measurements further eliminates the effects of crosstalk reflections which typically occur in these systems. A considerable increase in the sensitivity of the measurement in, for example, microwave gas spectroscopy, correlation radiometry and quadrupole measurement procedures can be achieved. Effective noise suppression can be obtained even with the use of only two modulators.

10 Claims, 7 Drawing Sheets

METHOD FOR DISTRUBANCE REDUCTION IN MEASUREMENT SYSTEMS FOR ANALYSIS OF EMISSION OR TRANSMISSION PROCESSES

FIELD OF THE INVENTION

The invention relates to a method for disturbance, or noise, and particularly crosstalk, reduction in measurement systems for analyzing emission or transmission processes in a serial arrangement of: a signal source; a measurement path, with or without a transmission test object; a detector; and an evaluation circuit, with modulation of the component of the signal carried in the measurement path and with narrow-band evaluation of the detector signal.

BACKGROUND OF THE INVENTION

In electric measurement technology, but in general also in physical measurement technology, a problem often occurs, in connection with a measuring arrangement consisting of a serial arrangement of a signal source, a measurement path with or without a transmission test object, and a detector, in measuring the electrical detector output signal in relation to its parameters (single frequency signals: amplitude, phase; random signals: output, correlation), and in part in relation to a reference signal (required during phase and correlation determination), in order in this way to draw conclusions as to the signal transmission within the measurement path (transmission) and thus the properties of the test object, or simply, if there is no test object, as to the properties of the source signal (emission).

Such measuring arrangements can be used for the examination of any type of physical transmission or emission process, including mechanical or thermal, but in particular acoustical, electrical, or optical processes, the detector being designed to change the physical parameter examined, e.g. pressure, field strength, etc., into an electrical voltage.

Noise signals having various origins may be superimposed on the signal representing the parameter to be detected. Certain noise signals may be connected with the examined transmission or emission process and are superimposed at the detector input on the component of the signal to be examined (e.g., optical process: incidence of scattered light; acoustical process: background noise). Others arise from noise sources of a nature not related to the process and falsify the detector output signal (e.g., noise in acoustic detectors—microphones—because of mechanical shock) as well because of further electrical noises which either are created in the detector (internal noise, interference direct current) or are superimposed on the detector output signal from outside noise sources (net ripple voltage, pick-up). Frequently, the presence of such noise signals renders the examination of weak desired signals in this simple arrangement impossible, because the desired component of the detector output signal often lies below the noise level.

It is known that if the signal transmitted in the measurement path which is to be measured is modulated with a periodic signal (identification modulation) prior to entering the detector, a separation of desired and noise components in the detector output signal becomes possible. This can be accomplished either by a direct modulation of the source signal or by insertion of a modulator element into the measurement path. Noise voltages can thus be filtered out by a narrow band evaluation (band pass filtering or synchronous detection) of the detector output signal on the modulation frequency.

Measuring systems are known in the field of microwave gas spectroscopy which modulate the absorption behavior of the gas sample by means of, for example, a low frequency electrical alternating field having a high voltage (strong modulation) and which evaluate the low alternating signals of the detector output signal according to the modulation frequency (Reinhard Reinschlüssel: *Ein Gassoektrometer hoher Nachweisempfindlichkeit im Millimeterwellenbereich* [Gas Spectrometer with High Detection Sensitivity in the Millimeter Wave Range]; Dissertation, Bochum 1985).

In the field of correlation measurement technology of noise signals, it is known to advantageously provide the input signal of the correlator with a periodic 0°/180° phase modulation in order to make possible suppression of the interfering direct current components of the correlator output signal and perhaps of additional noise voltages by means of filtering (e.g., see p. 17, FIG. 2.5 in Manfred Spaude: *Ein impedanzunabhangiges Messverfahren zur Bestimmung von Zweipol-Rauschtemperaturen im Hochfrequenzbereich* [A Measuring Method Independent of Impedance for the Determination of Two-pole Element Noise Temperatures in the High Frequency Range]; Dissertation, Bochum 1984).

Measurement of low electrical direct voltages or alternating voltages of low frequency is customarily performed by means of so-called "chopper amplifiers", which eliminate the drift problems of direct current-coupled amplifiers by "on-off" modulation and alternating current amplification.

Methods for the determination of the transmission damping, or loss, of a test object in a measurement arrangement consisting of a signal source, test object, detector, band pass filter and display are known from the field of electrical two-part parameter measurement technology, and achieve a direct identification modulation of the source signal (e.g., see p. I 12, FIG. 7 in H. Dalichau: *Hochfrequenzmesstechnik* [High Frequency Measuring Technology) in Meinke-Gundlach, "Taschenbuch der Hochfrequenzmesstechnik" [High Frequency Technology Handbook], Vol 1, publ. by K. Lange and K.-H. Löcherer, Heidelberg: Springer 1986).

To determine the complex transmission function of the test object, the detector may also be in the form of a null detector which is supplied with a component of the identification modulated source signal which can be adjusted for amplitude and phase (parallel substitution method).

Further known transmission measuring methods (homodyne measuring methods) effect an identification modulation by means of a modulating element located ahead of or behind the measured object in the measurement path. A synchronous detector (balanced mixer) supplied with ann unmodulated component of the source signal is used for detection (e.g., see p. 5, FIG. 1.1, R. J. King: *Microwave Homodyne Systems*, Peter Peregrinus Ltd., Southgate House, Stevenage, England 1978).

The principle of identification modulation is also used in connection with automatic homodyne two-part measurement methods which use as a detector a single sideband detector (p. 133, FIG. 4.9, Burkhard Schiek: *Meβsysteme der Hochfrequenztechnik* (Measurement systems for radio frequency technology) Heidelberg: Hüthig, 1984) or an amplitude/phase detector with cascaded binary phase modulation elements. (Burkhard Schiek, Uwe Gärtner, German patent application P34 25 961.3-35 of the Bargwargsuetband GmbH, Essen, W.-Germany).

It has proven disadvantageous in connection with use of all such types of identification modulation that crosstalk voltages appear at the detector output synchronously with the modulation signal, which crosstalk voltages are looped in via the electronic modulation components and cannot be filtered out. Because of the partially very high energy of the modulation signals (in particular in gas spectroscopy), they cannot be totally eliminated by shielding and limit the detection sensitivity of all devices.

As is also known (see King, supra., p. 38 et seq.), additional crosstalk signals occur in the use of identification modulation in particular in the field of homodyne two-part measurement methods. These signals are created by the reflection of components of the measuring signal at the not ideally matched modulator and lead to a signal from the measurement apparatus even when the test object is removed from the measuring arrangement (corresponding to infinitely high transmission loss) and thus falsely indicate a finite transmission loss of the test object. Even with test objects with finite loss these noise signals have a falsifying effect on the measurement results, if the amplitude of the signal transmitted by the test object is the same as or less than the amplitude as the noise signal.

It is known to reduce these reflections by the installation of directional elements or isolators in the measurement branch (see King, supra., pp. 38 et seq.). However, directional isolators are severely restricted in their desired frequency bandwidth because of their nature of non-reciprocal components and thus can only be used in a limited way.

SUMMARY OF THE INVENTION

It is an object of the invention to eliminate the electronic noise, and particularly low frequency and RF-crosstalk, associated with the customary methods of identification modulation and in particular to reduce the effects of the noise reflection generated by the modulators in identification modulation in connection with homodyne measurement circuits for two-part measuring, and thus to increase the sensitivity of all measuring devices.

This object is attained in accordance with the invention in that (a) modulation of the signal component carried in the measurement path is performed by means of n modulators (n>1) disposed in the measurement path, arbitrarily placed ahead of or behind a possible transmission test object, and controlled by modulation signal sources at respective frequencies $f_1$ to $f_n$, (b) narrow band evaluation of the detector signal is performed centered on a frequency $f_{BP}$, where $$f_{BP} = |m_1 f_1 + \ldots m_n f_n|$$

wherein each of the factors $m_1 \ldots m_n$ may assume the values $\pm 1, \pm 2, \pm 3 \ldots$, and (c) the single modulation frequencies $f_1 \ldots f_n$ and the evaluation frequency $f_{BP}$ are selected in such a way that the latter does not coincide with any one of the single modulation frequencies or one of their harmonics.

The multiple modulation in accordance with characteristic (a) of the signal component which is to be analyzed and which is carried in the measurement path causes a frequency shift of the identification modulation. If the center frequency $f_{BP}$ of the narrow band signal evaluation in accordance with characteristic (b) and if the single modulation frequencies in accordance with characteristic (c) are selected, the frequency range chosen for the signal evaluation is free of interference effects due to the single modulation signals, i.e., those which are looped into the signal evaluation as crosstalk as well as those which are generated by reflection at the modulation elements in homodyne quadrupolar measurement circuits.

Already an effective noise suppression results when the step of modulating is carried out with two modulators connected for modulating the signal component conducted in the measurement path, at locations between the source and the detector, with each modulator being controlled by a respective modulation signal source providing a modulation signal at a respective one of the individual modulation frequencies, and the step of effecting evaluation of the detector output signal is performed at a center frequency $f_{BP}$ equal to the sum or difference of the two individual modulation frequencies. This can be achieved with a technically simple structure with only two modulators, if characteristic (c), above, is observed.

According to preferred embodiments of the invention, the modulation signals are square wave signals.

A particularly efficient form of identification modulation is achieved in accordance with the invention by the use of 0°/180° phase modulators, if a phase-sensitive detection of the output signal of the measurement path is performed.

A further possibility of displacing the identification modulation into a noise-free frequency range results if one or more of the 0°/180° phase modulators are connected to effect a phase modulation of the reference signal of the phase-sensitive detector.

The invention removes the noise components which occur in prior art measurement circuits and increases the sensitivity during detection of emission or transmission processes giving rise to weak signals. Thus it has a high commercial value in the field of physical measurement technology. Possible areas of use are, for example, in connection with microwave humidity measuring, highly sensitive gas spectroscopy, noise measuring technology and two-part measuring technology (network analyzers).

The invention is described in greater detail below with reference to FIGS. 1 to 7.

DESCRIPTION OF THE PREFERRED EMBODIMENTS

Figure 1:
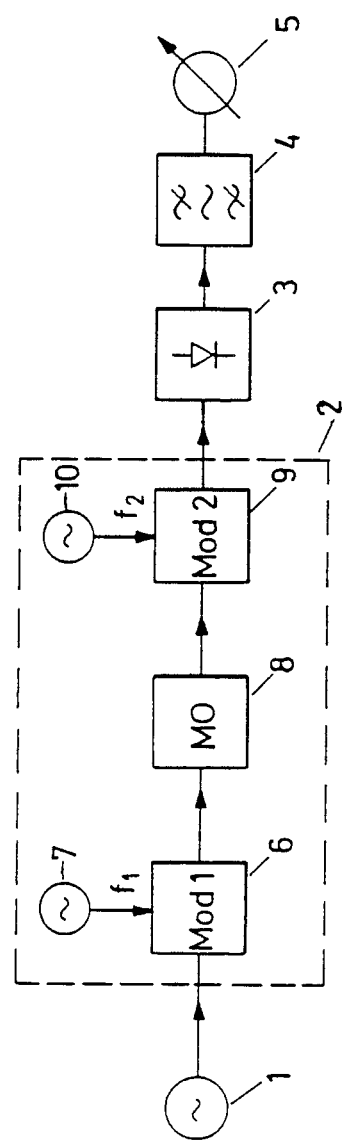
FIG. 1 is a block circuit diagram of a system according to an embodiment of the invention in the form of an example of a simple transmission circuit for the determination of the transmission attenuation effected by a test object.

FIG. 1 shows a transmission circuit as is partially known from p. I 12, FIG. 7 of the Dalichau reference cited above, having a signal source 1, e.g., an oscillator, a measurement path 2, a detector 3 and a narrow band display unit which here is composed of an electric bandpass filter 4 and a measurement and display circuit 5 to determine the signal parameters of the band filtered detector signal.

Measurement path 2 contains the test object 8 not necessarily required for the analysis of the source signal itself) as well as a first modulating element (Mod1) 6 with a modulation signal source 7 (in the case of a gas spectroscopy device, test object 8 and modulating element 6 would be structurally in the form of a gas-filled cell with modulation electrodes).

The source signal is modulated ahead of test object 8 by a modulation signal at the frequency $f_1$, because of which an identification modulation containing the frequency $f_1$ and in general also its multiples (harmonics) $m_1 \cdot f_1$, $m_1 = 2, 3, \ldots$ appears.

The signal emitted by test object 8, which will be weak in the case of objects with high insertion loss, is, in accordance with the present invention, further modulated, in a second modulating element (Mod2) 9 by a modulation signal of the frequency $f_2$ supplied by a modulation signal source 10 (in case of a gas spectroscopy device the second modulator would be realized for example as a second electrode path inside the gas-filled cell).

If both modulators are operated as described above, and narrow band evaluation of the detector output signal is performed on the sum or difference frequency of the two single modulation signals, an identification modulation of the combination frequencies, $f_k$, of $f_1$ and $f_2$ and their harmonics appears in addition to the frequencies $f_1$, $f_2$ and their multiples, i.e.:

$$f_k = |m_1 \cdot f_1 + m_2 \cdot f_2|, \text{ where } m_1, m_2 = 0, \pm 1, \pm 2 \ldots$$

The real ($m_1 \neq 0$, $m_2 \neq 0$) combination frequencies only derive from the signal component emitted by the test object which were modulated by the first and second modulating elements 6 and 9.

If the single frequencies $f_1$ and $f_2$ are chosen so that one or more combination frequencies do not coincide with the single frequencies and their harmonics, the combination frequencies can be selected as undisturbed identification modulation frequencies in connection with the filtering of the detector signal, since the signal components in connection with the combination frequencies can only arise as a result of the transmission process with double modulation and not as a result of noise pick-up of the single modulation signals.

Figure 2:
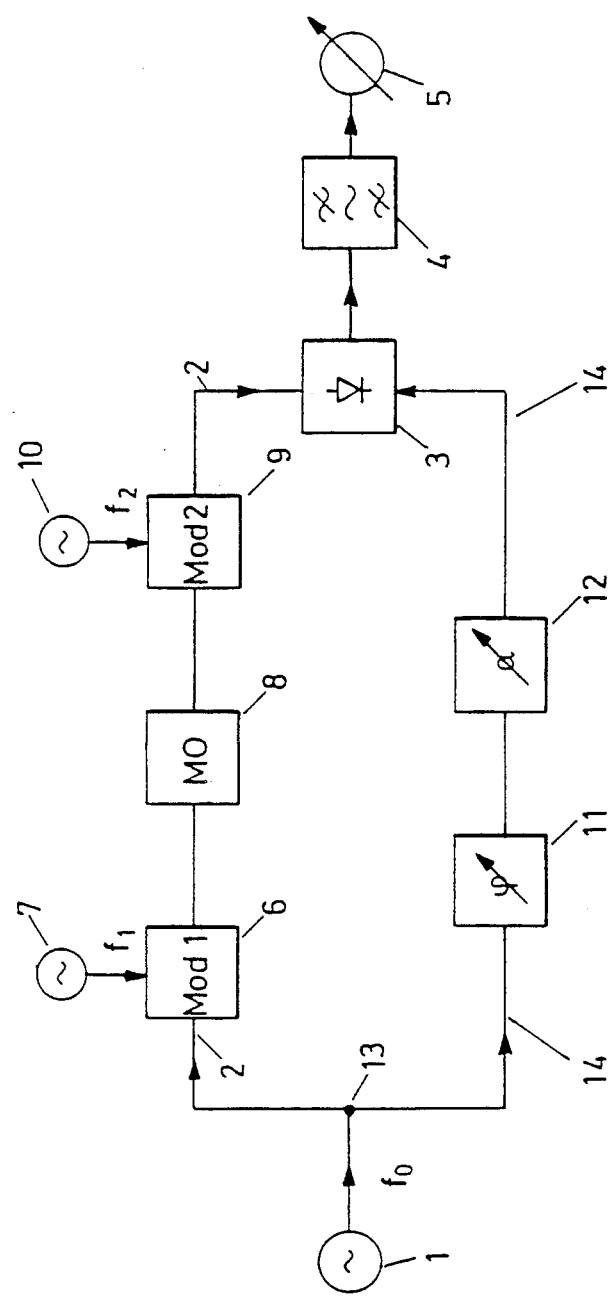
FIG. 2 is a block circuit diagram of the basic circuitry of a homodyne measurement device according to an embodiment of the invention for the determination of the electrical transmission function of a test object with modulation.
Figure 7:
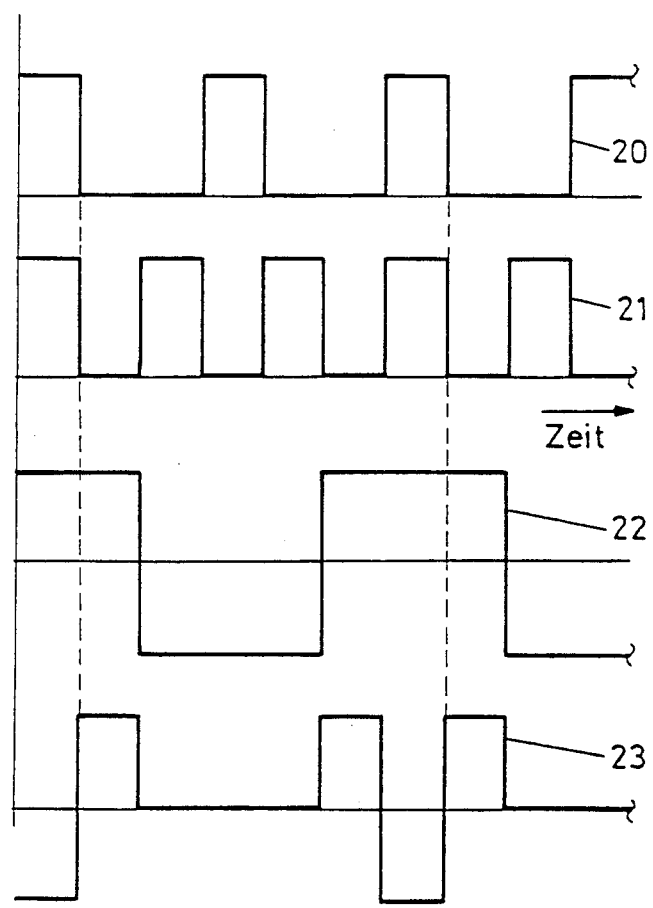
FIG. 7 is a signal diagram showing exemplary signal waveforms occurring during operation of embodiments of the present invention.

Implementation of the invention for reducing the influence of interfering modulator reflections in homodyne two-part parameter measurement circuits is shown in FIG. 2 which illustrates the bridge construction of a homodyne measurement device for determining the electrical transmission function of a test object such as is particularly known from page 5, FIG. 1.1 of the reference to King or p. 240, FIG. 7.8 of the reference to Groll.

*Groll: Mikrowellenmeßtechnik ]Microwave Measurement Technology], Braunschweig, Vieweg, 1969.

The signal from high-frequency oscillator 1 is split by a signal, or power, divider 13 into a component for the measurement path 2 and a component for a reference branch 14. The signal component carried in measurement path 2 is first modulated in first modulating element 6 which is controlled by modulation signal source 7 with a modulation signal at the frequency $f_1$ and then passes through the test object (MO) 8.

The signal component emitted or passed by test object 8 is, according to the invention, further modulated by second modulating element 9 which is controlled by further low-frequency signal source 10 with a modulation signal at the frequency $f_2$, and the resulting modulated signal is then processed in a phase-sensitive detector 3′ together with the signal component at the output end of reference branch 14. The latter signal component may have been acted on, in branch 14, depending on the design of the measurement circuit, by an adjustable phase shifter 11 and an adjustable attenuator 12. Detector 3′ may be in the form of a simple or balanced mixer.

For automatic measurements without the reference elements 11 and 12, embodiments in the form of single sideband detectors or of amplitude/phase detectors employing cascaded binary phase modulators can be provided.

The output signal of detector 3′ contains, besides an direct current component, alternating components at the frequencies $f_D$ which, in case only one modulating element 6 or 9 is being used, according to the prior art, coincide with the modulation frequency $f_1$ or $f_2$ and its harmonics, i.e.

$$F_0 = F_1 \text{ or } F_0 = F_2$$

The desired component of these signals stems from the component of the signal carried in the measurement path which passes through the test object and which was modulated ahead of or behind the test object. Besides this component transmitted by the test object, further interfering signal components are detected because of the modulator 6 or 9 which in practice is always mismatched and a lack of adequate isolation between measurement path and reference branch.

Two embodiments of the modulator are possible and customary:

(a) If an element in the position of the modulator 6 is used for modulation, a component of the signal entering the input of the mismatched modulator is modulated and reflected and reaches detector 3 via the finite decoupling of signal divider 13 and the reference branch 14, and is transformed—depending on the quality of balancing of detector 3′—into a low-frequency noise signal at the desired frequency $f_1$.

(b) If an element in the position of the modulator 9 is used for modulation, an unmodulated component of the signal carried in reference branch 14 can reach measurement path 2 via a finite decoupling of detector 3′ and can be transformed into a low-frequency noise signal at the desired frequency $f_2$ after modulation and reflection at the output of the mismatched modulator 9 at the measurement path input of detector 3′.

Both noise effects generate, in the detector output signal, components at the modulation frequency $f_1$ or $f_2$ and its harmonics which thus coincide with the signal frequencies of the desired component when only one modulator is employed. In the same way, the already mentioned electronic coupling of the modulation signal occurs in the output signal of an actually provided circuit and also causes an interference with the desired signal.

Since all of the possible interferences described above are independent of the desired signal in their signal amplitude (none of the signal components passes through the test object), they become particularly noticeable in the course of the measurement of structural elements with high insertion loss, or attenuation, and clearly limit the maximally achievable measuring sensitivity.

If in accordance with the invention, both modulators are employed, further signal components occur in the detected product in the combination frequencies $f_k$ of $f_1$ and $f_2$ and their harmonics:

$$f_k = |m_1 f_1 + m_2 f_2|, \text{ where } m_1, m_2 = 0, \pm 1, \pm 2$$

Here, again, as described with reference to FIG. 1, the real ($m_1 \neq 0$, $m_2 \neq 0$) combination frequencies only stem from the signal component transmitted by the test object which were modulated by both modulators 6 and 9.

Crosstalk signals which arise because of a double reflection, at the input of modulator 6 as well as at the output of modulator 9 and which also lead to combination products, are very highly attenuated because of the high path attenuation via the power divider, reference branch and detector.

By means of a band pass filter 4 having a passband centered on the frequency $f_{BP}$, a wanted signal component at the frequency $f_{BP}$, contained in the desired signal can be filtered out and routed to the measurement and display circuit 5.

In accordance with the invention, the modulation frequencies are advantageously selected such that neither they nor their harmonics coincide with the combination frequency used for evaluation, since otherwise a separation of noise signal and desired signal is not possible. A possible choice might be, for example, $f_1 = 30$ kHz and $f_2 = 20$ kHz with a desired frequency of $f_{BP} = f_1 - f_2 = 10$ kHz or $f_{BP} = f_1 + f_2 = 50$ kHz.

Figure 3:
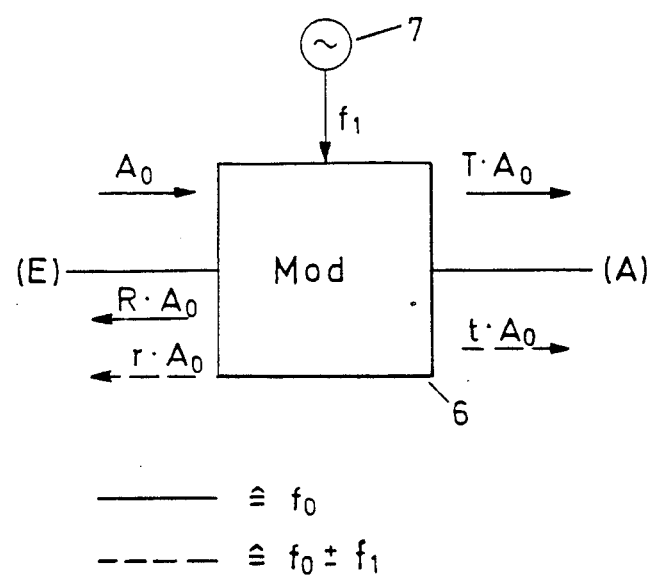
FIG. 3 illustrates the parameters of a modulator.

FIG. 3 illustrates the modulator characteristic values required for a quantitative estimation of crosstalk signal suppression. R designates the carrier level (carrier frequency $f_O$) reflected at the modulator input (E), T the carrier level transmitted by the modulator, r the signal level of the first upper and lower sidebands (sideband frequencies $f_O \pm f_l$, $f_l$: modulation frequency) reflected at the modulator input, and t the signal level of the first upper and lower sidebands transmitted by the modulator, respectively, in relation to the carrier level $A_O$ entering at the input.

For purposes of approximation, signal components of higher order sidebands (frequencies $f_O \pm m \cdot f_l$, where $m > 1$) shall be disregarded.

Typical characteristic values of conventional balanced microwave modulators (0°/180° phase modulators) are carrier signal) transmission factor $T < = -25$ dB, carrier reflection factor $R \leq = -5$ dB, single-sideband transmission factor $t \leq = -0$ dB, single-sideband reflection factor $r \leq = -25$ dB.

Figure 4:
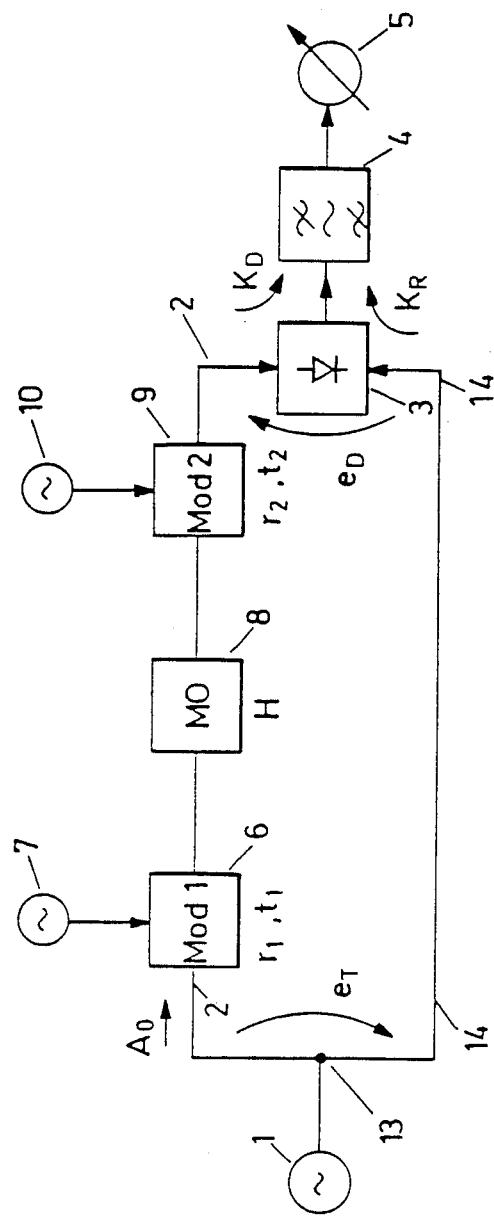
FIG. 4 illustrates the calculation of the improved noise signal suppression by means of multiple modulation.

FIG. 4 illustrates an equivalent circuit for the quantitative evaluation of the increase of the noise signal suppression realized with the embodiment of FIG. 2 with the characteristic values of the following components—signal divider 13: decoupling $e_T$; modulator 6: $r_1$, $t_1$; test object 8: loss H; modulator 9: $r_2$, $t_2$; and detector 3′: conversion factor $K_D$ for modulated signals of the measurement path, conversion factor $K_R$ for modulated signals of the reference branch, and decoupling $e_D$.

If, in accordance with the state of the art, only one modulator is used in the position of the element 6, the result, to a first approximation, using a signal level $A_O$ fed into measuring path 2 by signal divider 13, is a desired level of the detector output signal with the frequency $f_1$ of $$A_{N1} = A_O t_1 H K_d \quad (1)$$

and a noise level of $$A_{S1} = A_O r e_T k_L. \quad (2)$$

This results in a signal to noise ratio of $$S_1 = \frac{t_1}{r_1 \, e_T} \cdot \frac{K_d}{K_R} \cdot H \quad (3)$$

If a modulator is used in the position of element 9, the result is a desired level with the frequency $f_2$ of $$A_{N2} = A_O H \, t_2 K_D, \quad (4)$$

with the corresponding noise level $$A_{S2} = A_O \, e_D r_2 K_D, \quad (5)$$

and a signal to noise ratio of $$S_2 = \frac{t_2}{e_D \, r_2} \cdot H. \quad (6)$$

For $A_S 1$ and $A_S 2$ only the noise signals were considered which are independent of the test object loss and thus effective with high insertion loss.

If both modulators are operated, the following is true for the desired signal amplitude with $f_l \pm f_2$:

$$A_{N12} = A_O t_1 H \, t_2 K_D \quad (7)$$

and for the noise signal $$A_{S12} = A_O r e_T e_D r_2 K_D \quad (8)$$

for which reason the signal to noise ratio is increased to $$S_{12} = \frac{t_1 \, t_2}{r_1 \, r_2 \, e_T \, e_D} \cdot H \quad (9)$$

A numerical example demonstrates the considerable increase in the signal to noise ratio.

Let signal divider 13 have a decoupling of 15 dB and detector Circuit 3′ a decoupling of 30 dB:

$$e_T = -15 \text{ dB}; \; e_O = -30 \text{ dB}.$$

Furthermore, let the conversion factor of the detector for the reference branch be $K_R = 30$ dB or, for the measuring path $K_O = -6$ dB. With these values and the above mentioned typical characteristic values for balanced microwave mixers the result is:

$S_l = 58$ dB + H/dB, $S_2 = 49$ db + H/dB, while for the double modulation according to the invention, it is:

$S_{12} = 83$ dB + H/dB, i.e., an increase by 25 or 34 dB compared with the single signal noise conditions. A further improvement occurs because of the suppression of electronic interferences which was not considered in this calculation.

Figure 5A:
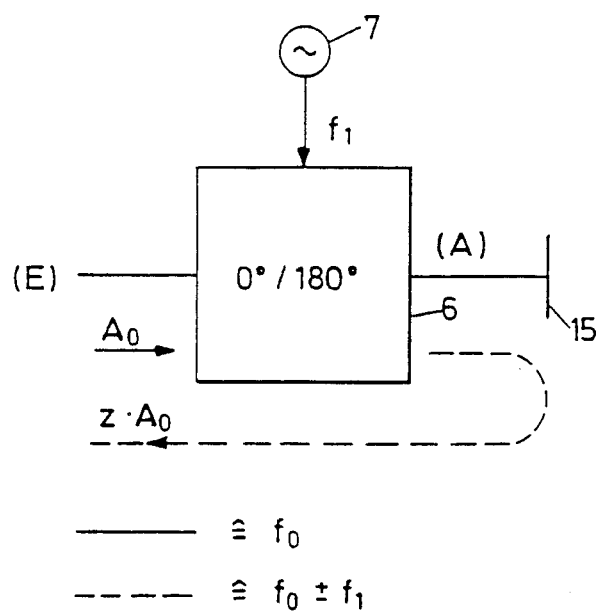
FIGS. 5a, 5b, 5c illustrate the improved noise suppression of a device in accordance with the invention.
Figure 5B:
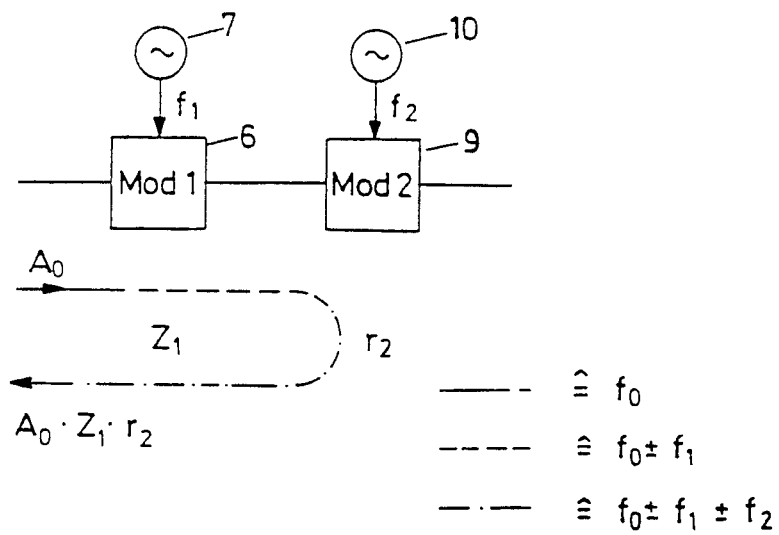
Figure 5C:
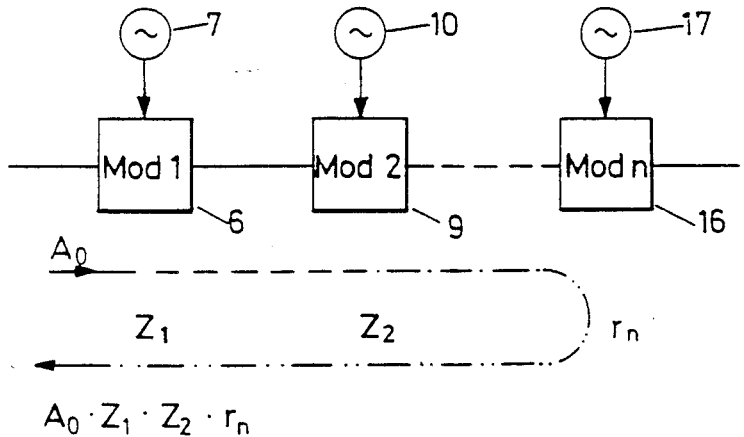

FIGS. 5a, 5b and 5c illustrate the advantages of a use of balanced modulators (0°/180° phase shifters) for the reduction of interfering modulator reflections when signal detection is effected by means of a phase-sensitive detector and a multi-modulation process is performed with cascaded balanced modulators.

Because the functional principle of balanced modulators is based on a 0°/180° phase switching of the carrier signal, signal components which are originally modulated during passage through modulator 6 from the input (E) to the output (A), then are reflected at an element 15 switched in behind the output and are finally modulated another time during a return passage, so that they are generally again unmodulated because of the double phase modulation of 2×180°. Because of an imperfect balancing of the modulator it is possible to specify a finitely small conversion factor z for the signal components which twice pass through the modulator. For a balanced microwave mixer, z is approximately $-20 \ldots -30$ dB.

In connection with the noise signal suppression in known measurement arrangements having a single balanced modulator in the position of the element 6 of FIG. 2, the ratio, $t_l/r_l$, of the transmitted signal level to the signal level reflected at the input (output) is relevant according to equation (3) in relation to the sideband frequencies $f_O \pm f_1$.

If, as shown in FIG. 5b, a further modulator 9 is connected behind the first modulator 6, the effectively active reflection factor $r_{12}$ of the combined circuit for signal components at combination frequencies $f_O \pm f_l \pm f_2$ is $$r_{12} = z_1 \cdot r_2 \tag{10}$$

while the effective transmission factor $t_{12}$ is $$t_{12} t_l t_2 \tag{11}$$

Thus the signal to noise ratio of a double modulator device is improved by the factor $t_1/z_1$ in respect to the operation with a single modulator. Again, the further improvement because of an increased suppression of electronic interferences has not been considered in this calculation.

As is easily recognizable, a further improvement of the method can be achieved by cascading additional modulators 16, as shown in FIG. 5c, each additional modulator having a respective signal source 17.

A possible choice of the modulation frequencies for such a three-stage device is $f_1 = 19$ kHz, $f_2 = 31$ kHz, $f_3 = 71$ kHz and a combination frequency of $f_{BP}$ of $f_3 - f_2 - f_1 = 21$ kHz.

Figure 6:
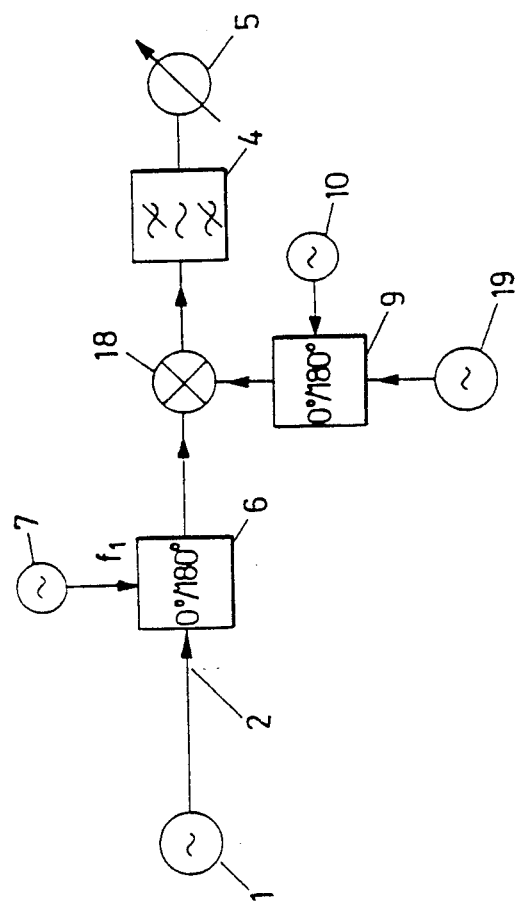
FIG. 6 is a block circuit diagram illustrating the phase modulation of the reference signal of a phase-sensitive detector in accordance with an exemplary embodiment of the invention employing correlation measurement technology.

FIG. 6 illustrates an exemplary embodiment for performing correlation measurement in which one of the 0°/180° phase modulators is connected for modulating the reference signal of the phase-sensitive detector instead of the signal component carried in the measurement path.

The output signal of a noise source 1 is conducted via a measuring path 2 to a first 0°/180° phase modulator 6 having a modulation signal source 7 and a correlator (product modulator) 18, acting as a detector and connected behind modulator 6.

A reference noise source 19 provides the reference signal. By means of a narrow band evaluation circuit, in this case a bandpass filter 4 with measurement and display circuit 5, the output signal is analyzed as to whether, when a signal component is missing at the identification modulation frequency, $f_1$, there is a complete absence of correlation of both noise signals (see p. 17, FIG. 2.5 of the Spaude reference). Because of an interference of the modulation signal with the display unit, a residual correlation of the noise source with the reference noise source would be simulated.

If, according to the present invention, the reference noise signal is also identification modulated by means of a second 0°/180° phase modulator 9 having a modulation signal source 10, it is possible (see the description relating to FIGS. 1 and 2, above) to select an interference free combination frequency of both modulation frequencies in the form of an identification modulation frequency and to detect it via the display circuit 4, 5.

FIG. 7 illustrates a pair of control functions for a double modulation method in which two modulators are being used for the modulation of the signal component carried in the measurement path, one of which is placed ahead of a possible test object and the other one is placed behind a possible test object and the modulators are controlled by modulation signal sources producing square wave, or digital, signals having the frequencies $f_1$ and $f_2$, respectively, and narrow band evaluation of the detector output signal is performed on the sum or difference frequency of the two single modulation signals.

If the modulating signal produced by source 7 has the waveform 20 with, for example, a frequency $f_1$ of 20 kHz and a pulse duty factor of 1:2, and the modulating signal produced by source 10 has the waveform 21 with, for example, a frequency $f_2$ of 30 kHz and a pulse duty factor of 1:1, they generate, when 0°/180° phase modulators and a phase-sensitive detector are used in any of the circuit arrangements described above, in an efficient manner a rectangular wave signal with the combination frequency of 10 kHz as illustrated by waveform 22 as a useful detector signal.

If the identification modulation has the form of an amplitude or intensity modulation, both control functions again result in an efficient identification on the combination frequency 10 kHz (qualitative variation in time of the detector alternating signal as shown by waveform 23).

Both control functions are easy to generate in practice and are free of subharmonic components.

While the description above identifies particular embodiments of the present invention, it will be understood that many modifications may be made without departing from the spirit thereof.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A method for disturbance reduction in a measurement system for analyzing an emission or transmission process, which system includes a serial arrangement of a signal source, a measurement path for conducting a component of the signal from the source, a detector for providing an output signal representative of the component conducted by the measurement path and a narrow-band evaluation circuit for evaluating the output signal, and further includes an element for modulating the signal component conducted in the measurement path from the source to the detector, comprising:

modulating the signal component by means of a plurality of modulators each operating at a respectively different individual modulation frequency $f_1 \ldots f_n$;

effecting narrow-band evaluation of the detector output signal at a center frequency $f_{BP}$, where $$f_{BP} = |m_1 f_1 + \ldots m_n f_n|$$

and the factors $m_1 \ldots m_n$ may assume the values $\pm 1, \pm 2, \pm 3 \ldots$; and giving the individual modulation frequencies $f_1 \ldots f_n$ and the center frequency $f_{BP}$ respective values such that frequency $f_{BP}$ does not coincide with any one of the individual modulation frequencies or any harmonic thereof.

2. A method as defined in claim 1 wherein
   said step of modulating is carried out with two modulators connected for modulating the signal component conducted in the measurement path, at locations between the source and the detector, with each modulator being controlled by a respective modulation signal source providing a modulation signal at a respective one of the individual modulation frequencies; and said step of effecting evaluation of the detector output signal is performed at a center frequency $f_{BP}$ equal to the sum or difference of the two individual modulation frequencies.

3. A method as defined in claim 2 further comprising disposing a test object in the measurement path so that the test object influences the signal component.

4. A method as defined in claim 3 wherein the test object is disposed between the two modulators.

5. A method as defined in claim 1 further comprising disposing a test object in the measurement path so that the test object influences the signal component.

6. A method as defined in claim 1 wherein said step of effecting modulation is performed by means of 0°/180° phase modulators and the detector is a phase-sensitive detector connected to receive a reference signal.

7. A method as defined in claim 6 wherein at least one of the 0°/180° phase modulators is connected for modulating the reference signal of the phase-sensitive detector.

8. A method as defined in claim 7 wherein a second one of the modulators is disposed in the measurement path for modulating the signal component.

9. A method as defined in claim 8 further comprising disposing a test object in the measurement path so that the test object influences the signal component.

10. A method as defined in claim 9 wherein the test object is disposed between the second one of the modulators and the detector.

* * * * *